United States Patent
Bang

(10) Patent No.: US 9,206,967 B2
(45) Date of Patent: Dec. 8, 2015

(54) DISPLAY DEVICE USING SEMICONDUCTOR LIGHT EMITTING DEVICE

(71) Applicant: LG ELECTRONICS INC., Seoul (KR)

(72) Inventor: Kyuhyun Bang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/506,308

(22) Filed: Oct. 3, 2014

(65) Prior Publication Data

US 2015/0116985 A1 Apr. 30, 2015

(30) Foreign Application Priority Data

Oct. 24, 2013 (KR) .......................... 10-2013-0127356

(51) Int. Cl.
| | | |
|---|---|---|
| H01L 33/62 | (2010.01) | |
| F21V 23/00 | (2015.01) | |
| G02F 1/01 | (2006.01) | |
| H01L 33/50 | (2010.01) | |
| G02F 1/00 | (2006.01) | |
| H01L 25/075 | (2006.01) | |
| H01L 33/52 | (2010.01) | |
| F21Y 101/02 | (2006.01) | |
| F21Y 113/00 | (2006.01) | |

(52) U.S. Cl.
CPC ................ *F21V 23/001* (2013.01); *G02F 1/00* (2013.01); *G02F 1/0105* (2013.01); *H01L 25/0753* (2013.01); *H01L 33/50* (2013.01); *F21Y 2101/02* (2013.01); *F21Y 2113/005* (2013.01)

(58) Field of Classification Search
CPC ............ H01L 23/48–23/5389; H01L 25/0753; H01L 33/50; H05B 33/00–33/28; F21V 23/001; G02F 1/00; G02F 1/0105; F21Y 2101/02; F21Y 2113/005
See application file for complete search history.

(56) References Cited

U.S. PATENT DOCUMENTS

2006/0007076 A1 * 1/2006 Sheats et al. ..................... 345/76
2012/0161618 A1 * 6/2012 Kwon et al. ................... 313/506

FOREIGN PATENT DOCUMENTS

| JP | 2007-287609 A | 11/2007 |
|---|---|---|
| JP | 2011-96876 A | 5/2011 |
| KR | 10-2010-0097442 A | 9/2010 |
| KR | 10-2011-0034057 A | 4/2011 |

* cited by examiner

*Primary Examiner* — Anh Mai
*Assistant Examiner* — Nathaniel Lee
(74) *Attorney, Agent, or Firm* — Birch, Stewart, Kolasch & Birch, LLP

(57) ABSTRACT

Discussed is a display device including a substrate having at least one of a first and a second electrode, a conductive adhesive layer configured to cover the wiring substrate, and a plurality of semiconductor light emitting devices coupled to the conductive adhesive layer, and electrically connected to the first and second electrode, wherein the conductive adhesive layer has a first conductive adhesive layer disposed in a first region and a second conductive adhesive layer disposed in a second region adjoining to the first region such that the conductive adhesive layer is partitioned into a plurality of regions on the wiring substrate.

20 Claims, 20 Drawing Sheets

DISPLAY DEVICE USING SEMICONDUCTOR LIGHT EMITTING DEVICE

CROSS-REFERENCE TO RELATED APPLICATIONS

This application claims the benefit of priority to Korean Patent Application No. 10-2013-0127356, filed on Oct. 24, 2013, the contents of which is herein expressly incorporated by reference in its entirety.

BACKGROUND OF THE INVENTION

1. Field of the Invention

The embodiments of the invention relate to a display device, and more particularly, to a display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as mediocre response time, difficult implementation of flexibility in the instance of LCDs, and there exist drawbacks such as short life span, mediocre yield as well as low flexibility in the instance of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

Furthermore, in addition, it may be possible to conceive the structure of enhancing improvement of yield for a flexible display using semiconductor light emitting devices.

SUMMARY OF THE INVENTION

An aspect of the embodiment of the invention is to provide a structure for enhancing the yield of a display device in which a semiconductor light emitting device is implemented as a sub-pixel.

Another aspect of the embodiment of the invention is to provide a display device having conduction reliability when connecting a semiconductor light emitting device to an electrode line.

In order to accomplish the foregoing tasks, a display device according to an embodiment of the invention may include a substrate having at least one of a first and a second electrode, a conductive adhesive layer configured to cover the wiring substrate, and a plurality of semiconductor light emitting devices coupled to the conductive adhesive layer, and electrically connected to the first and second electrode, wherein the conductive adhesive layer has a first conductive adhesive layer disposed in a first region and a second conductive adhesive layer disposed in a second region adjoining to the first region such that the conductive adhesive layer is partitioned into a plurality of regions on the wiring substrate.

According to an example associated with the embodiment of the invention, a boundary portion between the first conductive adhesive layer and a second conductive adhesive layer may be formed between the plurality of semiconductor light emitting devices. The semiconductor light emitting devices may be disposed along a plurality of rows, and the boundary portion may be formed in parallel to the rows between at least part of the plurality of rows. The first and the second electrode may be formed with a plurality of lines, respectively, and either one of a plurality of lines of the first electrode and a plurality of lines of the second electrode may be arranged along the plurality of rows.

The boundary portion may have a first boundary portion and a second boundary portion formed on the first conductive adhesive layer and the second conductive adhesive layer, respectively, and the first and the second boundary portion may be in contact with each other between the plurality of semiconductor light emitting devices.

According to another example associated with the embodiment of the invention, the conductive adhesive layer may include a plurality of anisotropic conductive films (ACFs) coupled to the substrate. The plurality of anisotropic conductive films may have a first and a second anisotropic conductive film corresponding to the first and the second conductive adhesive layer, and boundary portions between the first and the second anisotropic conductive film may be in contact with each other according to deformation due to thermal compression. The plurality of anisotropic conductive films may be thermally compressed in a state that they are disposed to be separated from each other, and the boundary portions may be in contact with each other as resin flows due to the thermal compression to fill a space between the plurality of anisotropic conductive films.

According to still another example associated with the embodiment of the invention, the conductive adhesive layer may include a single anisotropic conductive film (ACF) coupled to the substrate, and the first conductive adhesive layer and second conductive adhesive layer may be partitioned by a through hole passing through the single anisotropic conductive film. The through hole may be formed in an elongated manner to form a line. The through hole may be filled according to the deformation of the single anisotropic conductive film due to thermal compression.

According to yet still another example associated with the embodiment of the invention, at least part of the plurality of semiconductor light emitting devices may be buried in the conductive adhesive layer, and the conductive adhesive layer may have a non-transparent resin to block light from being transmitted through a boundary portion between the first conductive adhesive layer and the second conductive adhesive layer. The non-transparent resin may include a black or white resin.

According to still yet another example associated with the embodiment of the invention, the wiring substrate may be any one of flexible polyimide (PI), polyethylene naphthalate (PEN), and polyethylene terephthalate (PET) substrates.

According to still yet another example associated with the embodiment of the invention, each of the plurality of regions may have a length and a width that are different from each other.

According to still yet another example associated with the embodiment of the invention, each of the plurality of semiconductor light emitting devices may emit light of at least one of red light, green light, blue light and ultraviolet light.

According to still yet another example associated with the embodiment of the invention, a phosphor layer may convert a predetermined light into at least one of red light, green light and blue light.

According to yet still another example associated with the embodiment of the invention, the plurality of regions may be disposed along the arrangement of the first electrode or disposed along the arrangement direction of the second electrode.

Furthermore, according to the embodiment of the invention, there is disclosed a method of fabricating a display device, including forming a plurality of conductive adhesive layers on a first substrate containing an electrode, allowing a second substrate disposed with a plurality of semiconductor light emitting devices to be disposed such that the electrode faces the semiconductor light emitting devices, thermally compressing the first substrate to the second substrate to couple the semiconductor light emitting device to the plurality of conductive adhesive layers, and removing the second substrate, wherein the plurality of conductive adhesive layers are disposed to be separated from each other to have a space that can be expanded during the thermal compression. The space may be filled by the expansion of the plurality of conductive adhesive layers due to the thermal compression to allow the boundary portions of the plurality of conductive adhesive layers to be contact with each other.

According to the embodiment of the invention having the foregoing configuration, a distance between semiconductor light emitting devices may be sufficiently large and a conductive adhesive layer may have softness, thereby implementing a rollable display device.

Furthermore, according to the embodiment of the invention, a conductive adhesive layer may be partitioned into a plurality of regions, thereby allowing a resin thickness of an adhesion portion to be uniform during the connection of electrode lines of the upper and lower substrates. Through this, it may be possible to enhance a yield of a display device, and secure conduction reliability during the connection of lines.

DETAILED DESCRIPTION OF THE EMBODIMENTS

Figure 1:
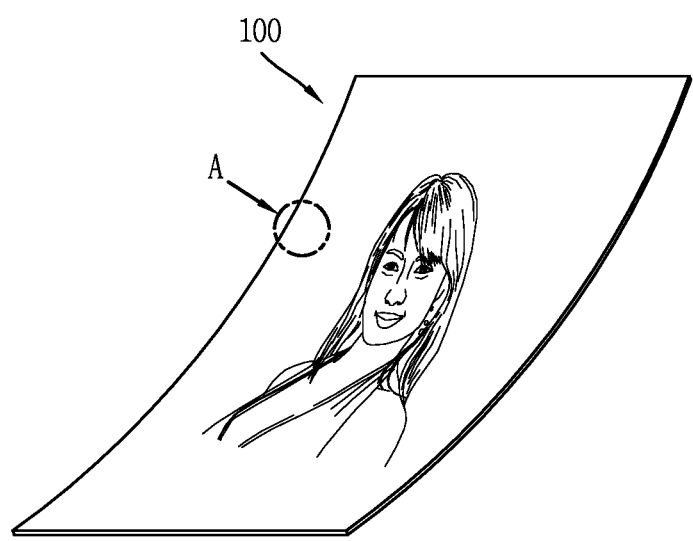
FIG. 1 is a conceptual view illustrating a display device using a semiconductor light emitting device according to an embodiment of the invention.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments disclosed herein, moreover, the detailed description will be omitted when a specific description for publicly known technologies to which the invention pertains is judged to obscure the gist of the embodiment of the invention. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the invention.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the embodiment of the invention, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
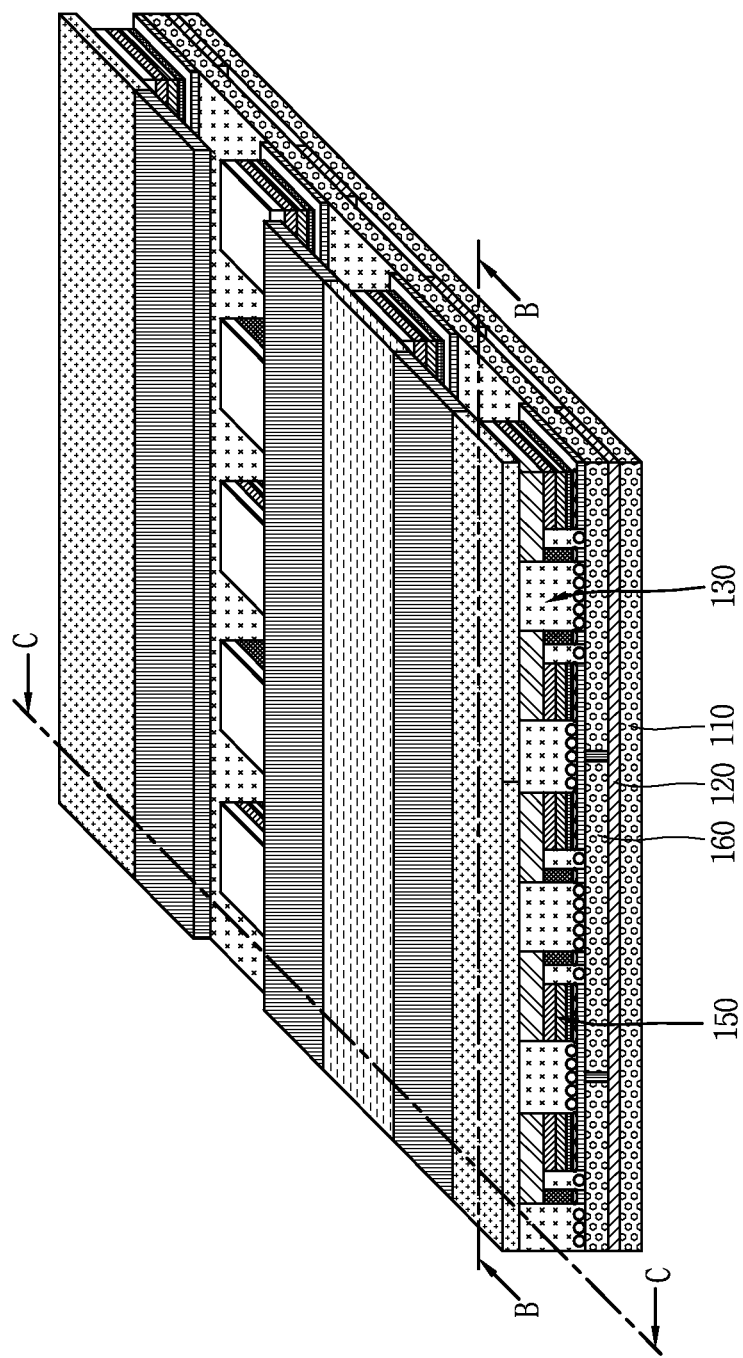
FIG. 2 is a partial enlarged view of portion "A" in FIG. 1, and FIGS. 3A and 3B are cross-sectional views taken along lines B-B and C-C in FIG. 2.
Figure 3A:
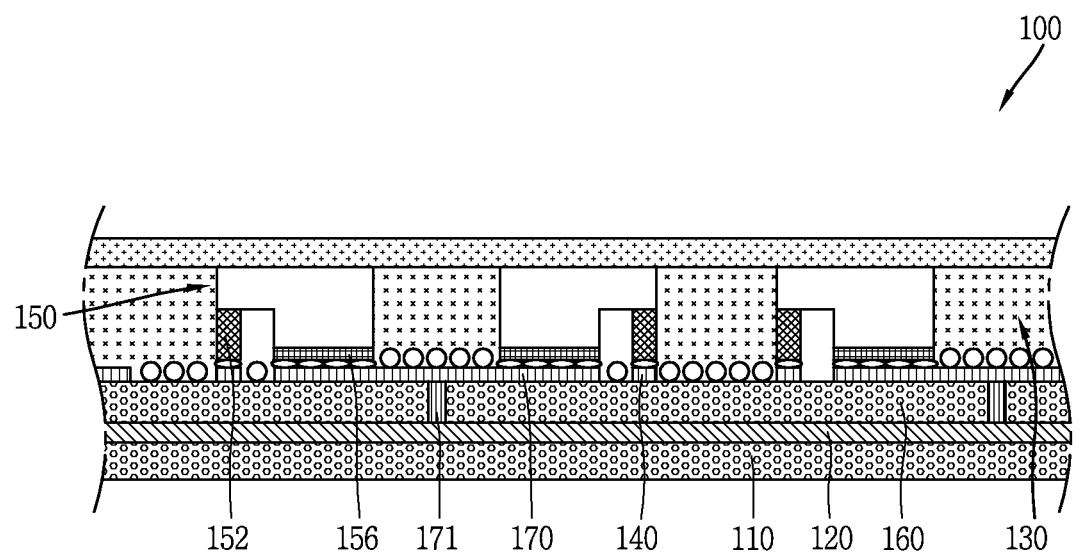
Figure 3B:
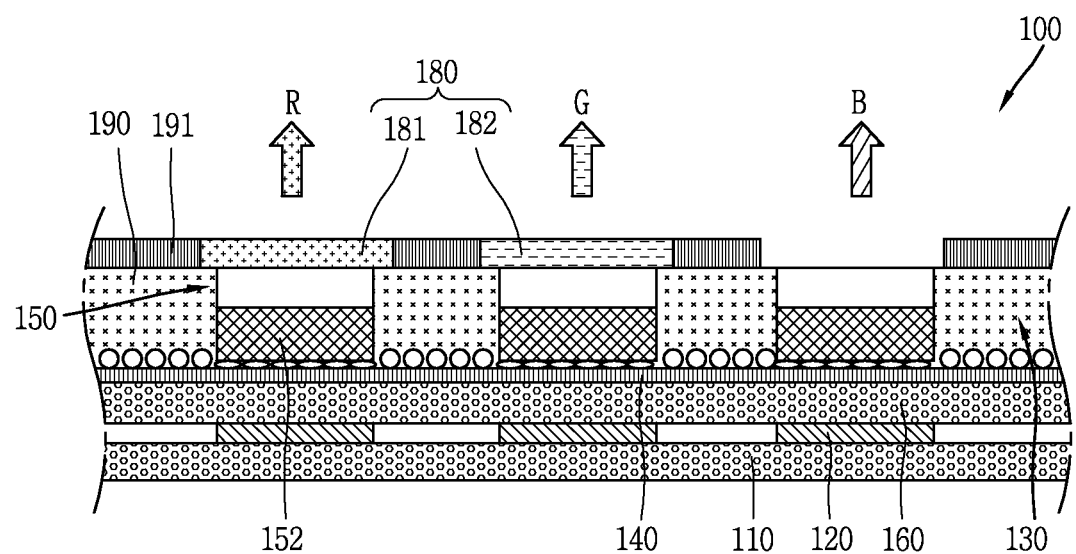
Figure 4:
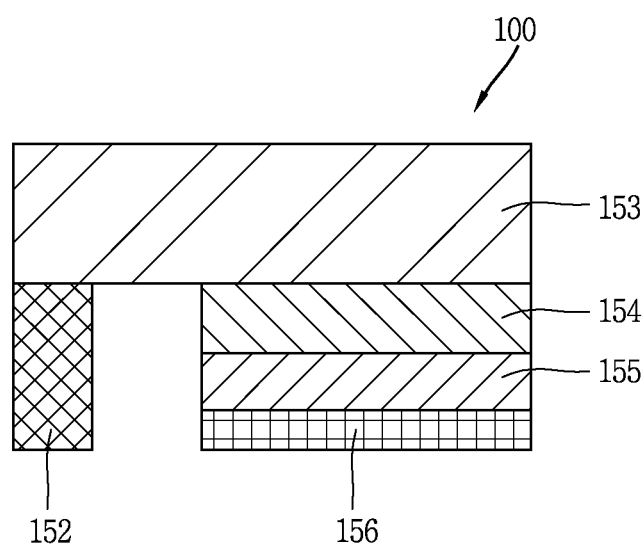
FIG. 4 is a conceptual view illustrating a flip-chip type semiconductor light emitting device in FIG. 3A.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device. However, the following illustration may be also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the embodiment of the invention may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the embodiment of the invention, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this instance, it may have conductivity by means of the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the embodiment of the invention may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to a welding portion by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no pushdown of the semiconductor light emitting device.

Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices are grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this instance, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this instance, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the embodiment of the invention may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the embodiment of the invention may not be necessarily limited to this, and another structure for implementing blue, red and green may be also applicable thereto.

Figure 5A:
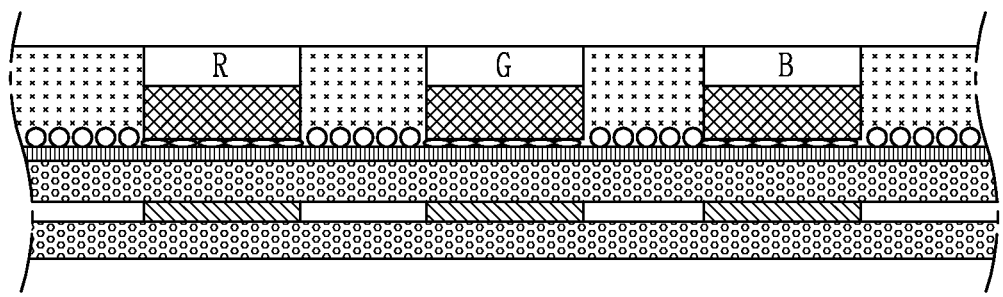
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
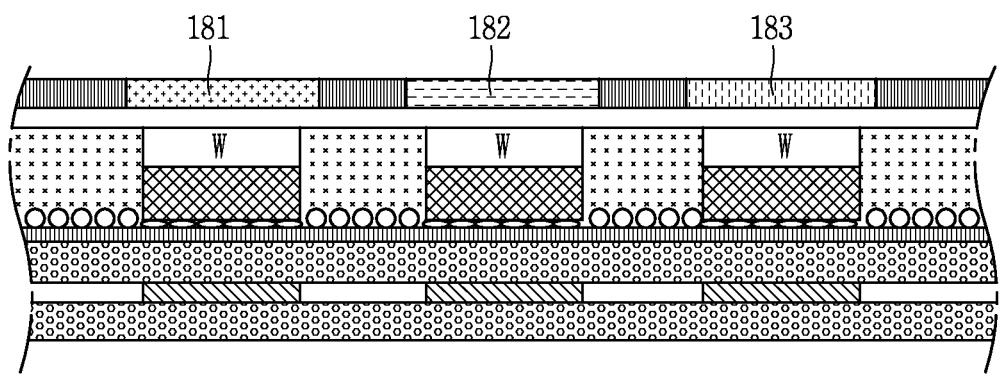

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
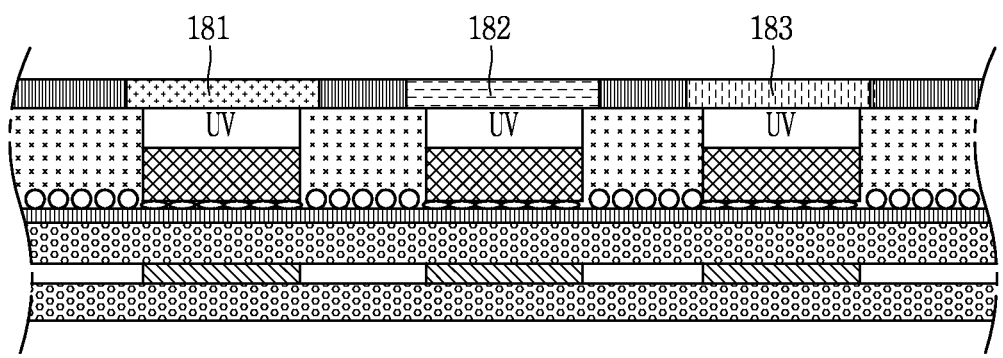

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the embodiment of the invention into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 µm in the length of one side thereof, and formed with a rectangular or square shaped element. In an instance of a rectangular shaped element, the size thereof may be less than 20×80 µm.

Furthermore, even when a square shaped semiconductor light emitting device 150 with a length of side of 10 µm is used for a sub-pixel, it will exhibit a sufficient brightness for implementing a display device. Accordingly, for example, in the instance of a rectangular pixel in which one side of a sub-pixel is 600 µm in size, and the remaining one side thereof is 300 µm, a relative distance between the semiconductor light emitting devices becomes sufficiently large. Accordingly, in this instance, it may be possible to implement a flexible display device having a HD image quality.

A display device using the foregoing semiconductor light emitting device will be fabricated by a new type of fabrication method. Hereinafter, the fabrication method will be described with reference to FIG. 6.

Figure 6:
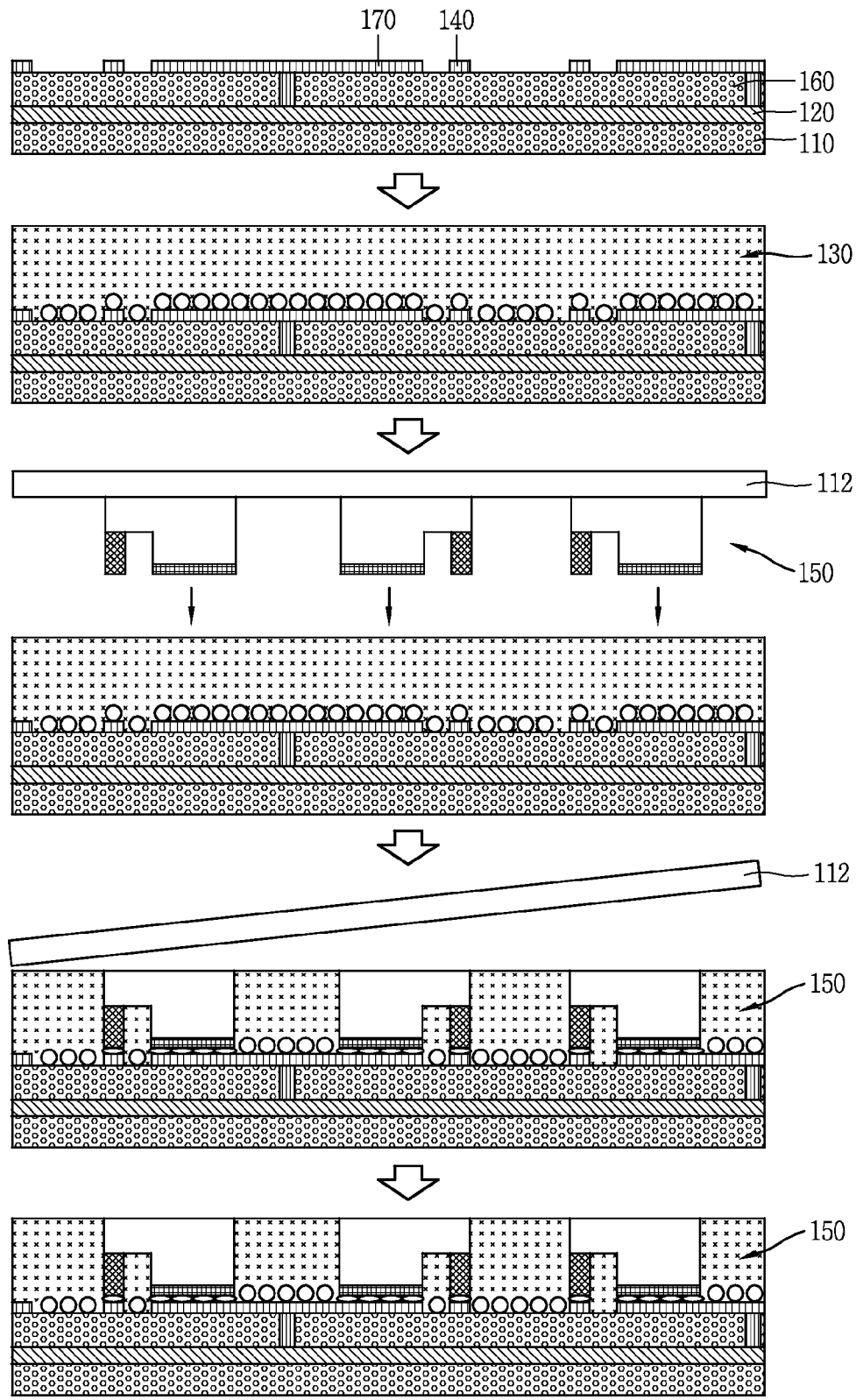
FIG. 6 is cross-sectional views illustrating a method of fabricating a display device using a semiconductor light emitting device according to the embodiment of the invention.

FIG. 6 is cross-sectional views illustrating a method of fabricating a display device using a semiconductor light emitting device according to the embodiment of the invention.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, the second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
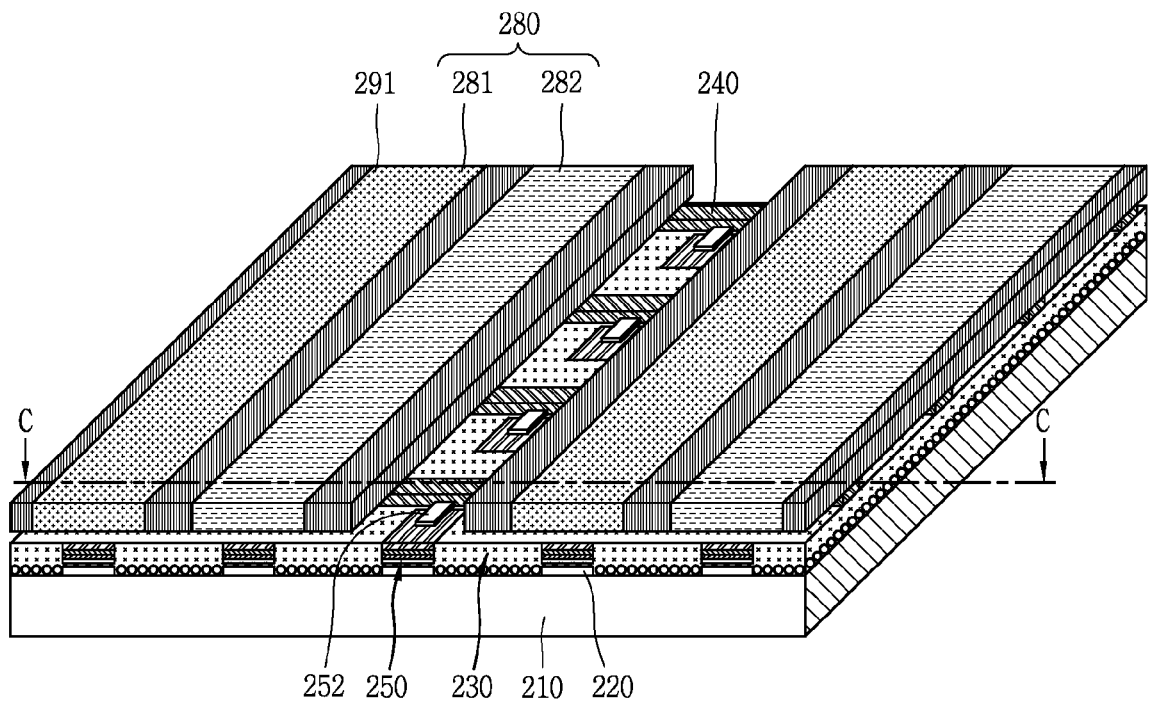
FIG. 7 is a perspective view illustrating a display device using a semiconductor light emitting device according to another embodiment of the invention.
Figure 8:
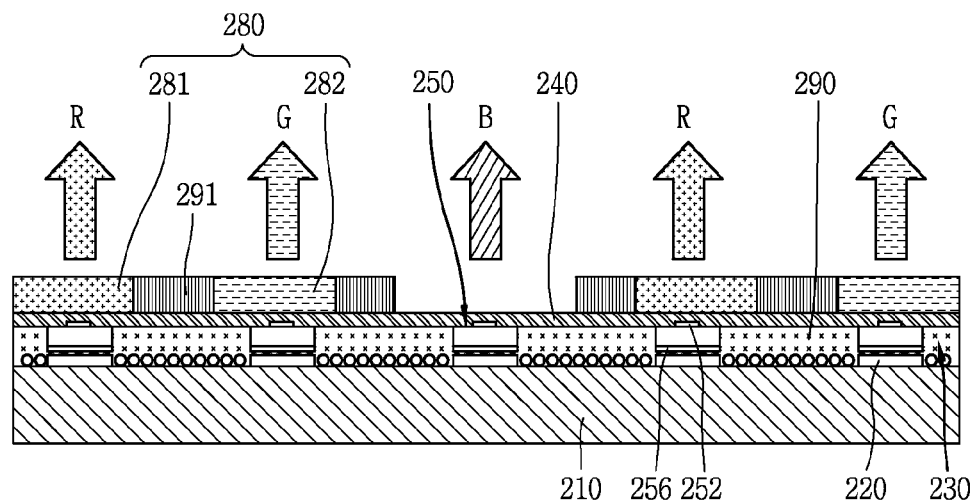
FIG. 8 is a cross-sectional view taken along line C-C in FIG. 7.
Figure 9:
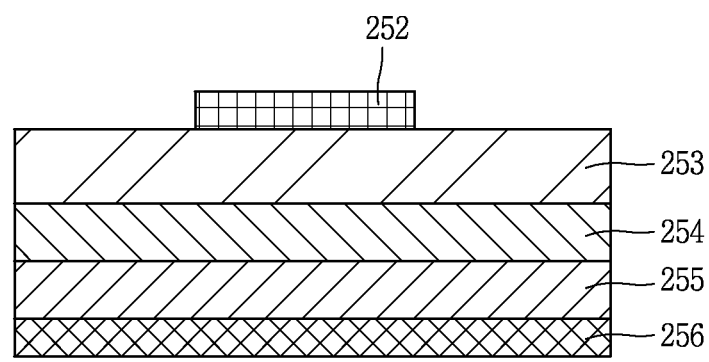
FIG. 9 is a conceptual view illustrating a vertical type semiconductor light emitting device in FIG. 8.

FIG. 7 is a perspective view illustrating a display device using a semiconductor light emitting device according to another embodiment of the invention. FIG. 8 is a cross-sectional view taken along line C-C in FIG. 7, and FIG. 9 is a conceptual view illustrating a vertical type semiconductor light emitting device in FIG. 8.

According to the drawings, the display device may be display device using a passive matrix (PM) type of vertical semiconductor light emitting device.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the embodiment of the invention illustrates an instance where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof.

The size of the individual semiconductor light emitting device 250 may be less than 80 μm in the length of one side thereof, and formed with a rectangular or square shaped element. In an instance of a rectangular shaped element, the size thereof may be less than 20×80 μm.

The semiconductor light emitting device 250 may be a vertical structure.

A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel.

However, the embodiment of the invention may not be necessarily limited to this, and another structure for implementing blue, red and green may be also applicable thereto as described above in a display device to which a flip chip type light emitting device is applied.

Taking the embodiment of the invention into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it may be possible to implement a full color display in which the sub-pixels of red (R), green (G) and blue (B) implement one pixel by means of the semiconductor light emitting device.

A structure capable of securing conduction reliability during the connection between a semiconductor light emitting device and an electrode line may be taken into consideration in a display device using the foregoing semiconductor light emitting device according to the embodiment of the invention. Hereinafter, a structure capable of securing the conduction reliability will be described.

Figure 10A:
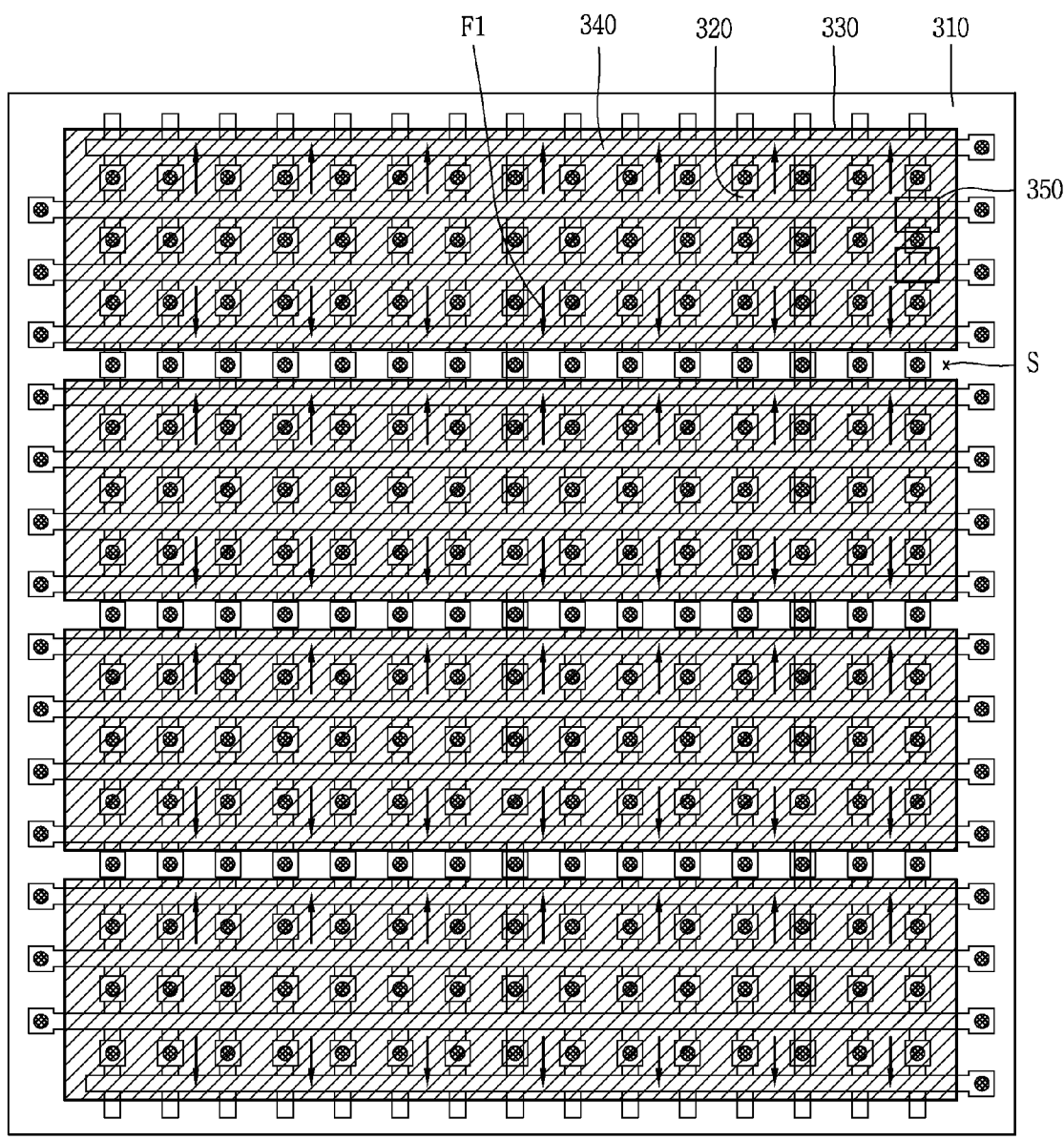
FIGS. 10A and 10B are conceptual views illustrating an instance where a conductive adhesive layer is partitioned into a plurality of regions and an instance where the conductive adhesive layer is not partitioned into a plurality of regions in a display device using a semiconductor light emitting device according to the embodiment of the invention.
Figure 10B:
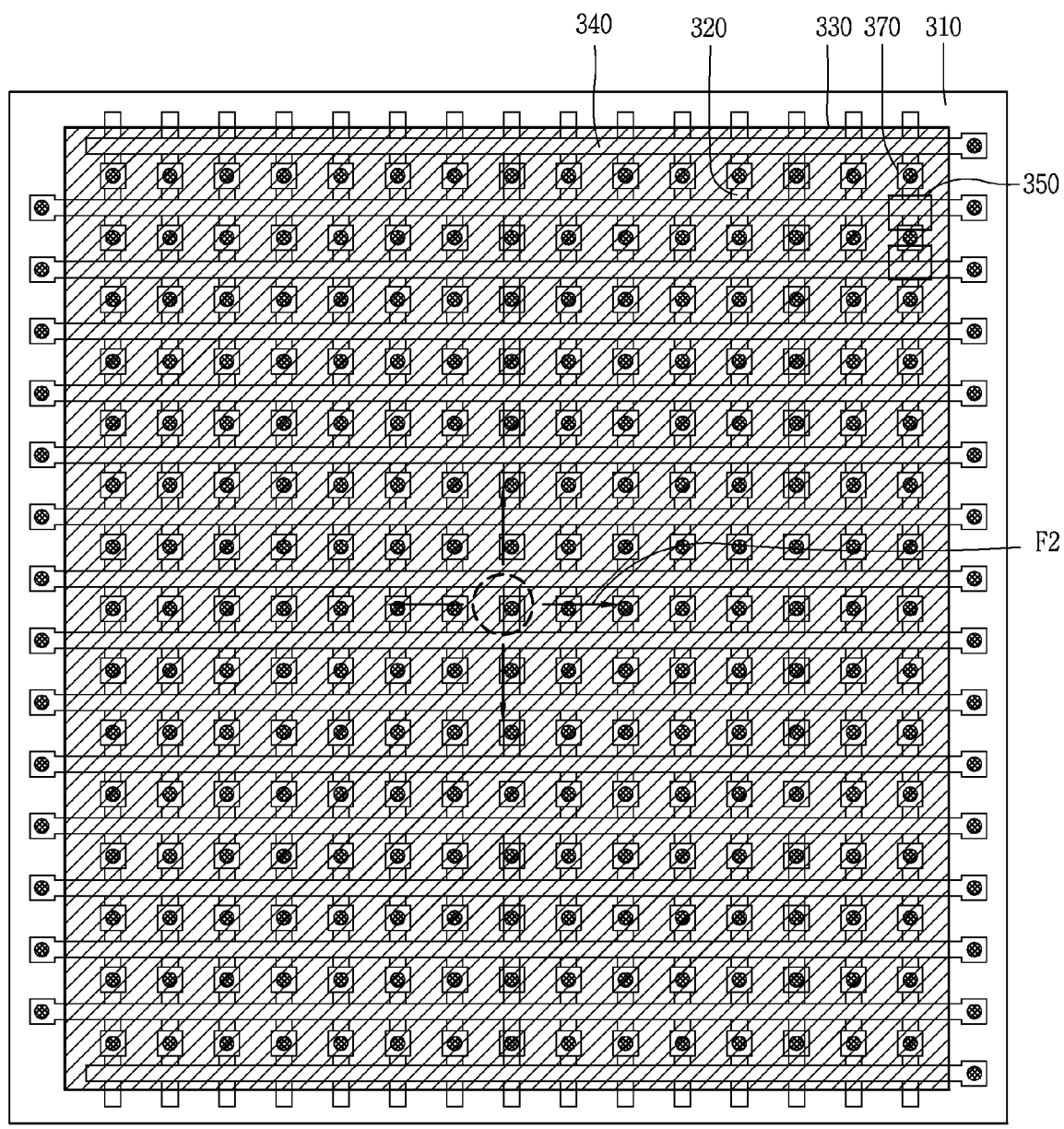
Figure 11A:
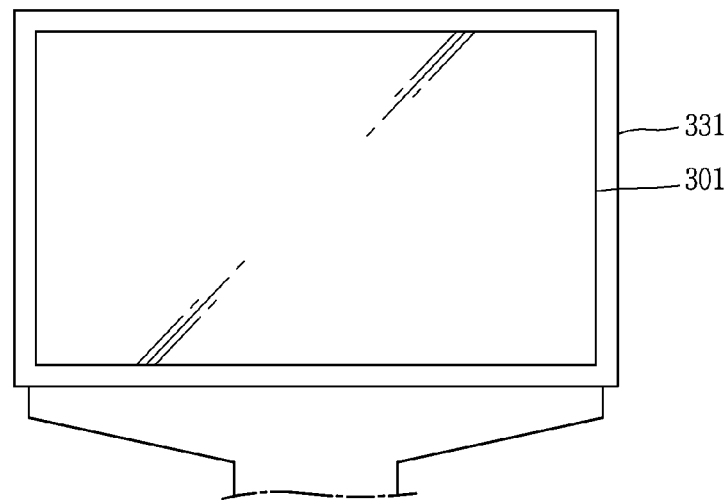
FIGS. 11A and 11B are conceptual views illustrating deformation due to the thermal adhesion of a conductive adhesive layer.
Figure 11B:
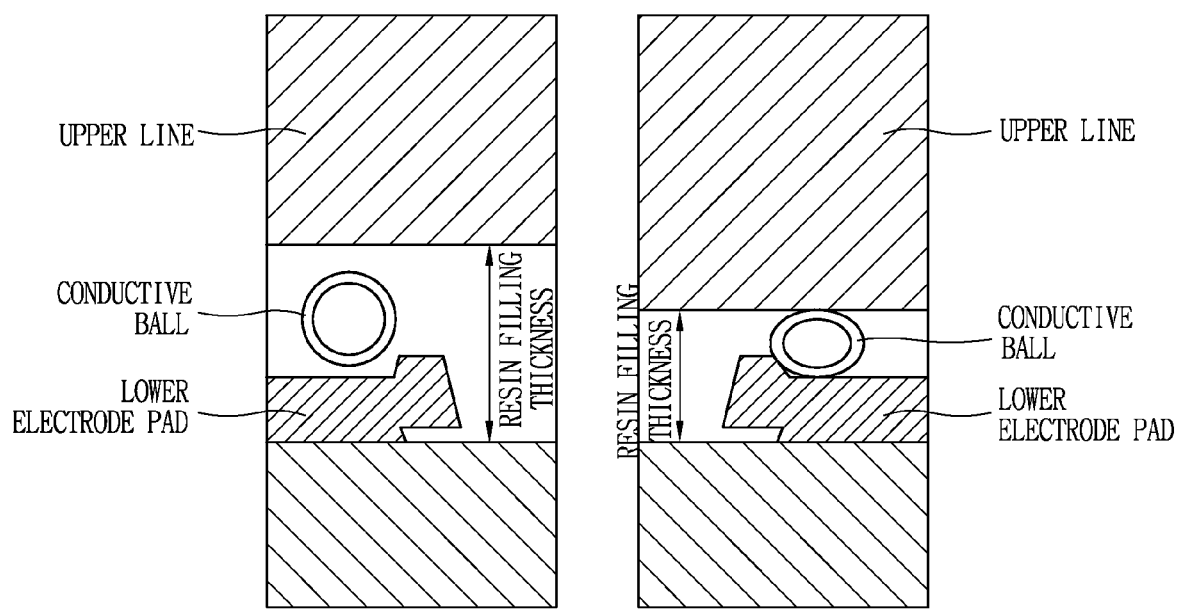

FIGS. 10A and 10B are conceptual views illustrating an instance where a conductive adhesive layer is partitioned into a plurality of regions and an instance where the conductive adhesive layer is not partitioned into a plurality of regions in a display device using a semiconductor light emitting device according to the embodiment of the invention, and FIGS. 11A and 11B are conceptual views illustrating deformation due to the thermal adhesion of a conductive adhesive layer.

The drawings are schematic diagrams in which a plan view subsequent to thermal compression between a wiring substrate 310 of a display device and a wafer of a semiconductor light emitting device 350 using an anisotropic conductive film is enlarged.

Referring to FIG. 10A, a growth substrate in which the semiconductor light emitting device 350 is grown, the conductive adhesive layer 330 and the wiring substrate 310 are sequentially deposited to electrically connect the wiring substrate 310 to the semiconductor light emitting device 350, and thermal compression is carried out in this state. According to the embodiment of the invention, the conductive adhesive layer 330 may be an anisotropic conductive film.

According to the embodiment of the invention, an anisotropic conductive film is disposed to be partitioned into a predetermined shaped gap and width, and the disposed films match between the horizontal line electrode 340 of the wiring substrate. In other words, the conductive adhesive layer is partitioned into a plurality of regions. A space (S) formed between films by the partition performs the role of a channel in which the resin of the anisotropic conductive film can flow and move in the flow direction (F1) toward the space.

When there is no partition as illustrated in FIG. 10B, the resin of the anisotropic conductive film mostly flows in the left and right direction when thermally adhered to the wiring substrate 310 formed by separating a horizontally directional electrode 340 from a vertically directional auxiliary electrode (electrode pad) 370. Furthermore, in the instance of a wafer formed with the semiconductor light emitting device 350 on the wiring substrate in a one-to-one matching manner, resin mostly flows in the vertical direction according to the arrangement direction of the semiconductor light emitting device 350. According to the foregoing structure, it may cause a problem in which the flow direction (F2) of resin at a central portion becomes a direction that cannot flow to the outside.

Furthermore, when a large area of anisotropic conductive film is used, it may cause a phenomenon in which resin at the central portion of the adhesion surface cannot sufficiently flow to the outside portion. In the instance of resin contained in the anisotropic conductive film, it is cured within several seconds during thermal adhesion as well as has a viscosity that cannot sufficiently flow within several seconds when the movement distance of resin becomes long. Accordingly, a cause of preventing the flow of resin may include acting as a barrier to resin flow due to the complicated shape of a line or pad on the wiring substrate, a long distance moving path of resin flow according to a large area of the adhesion surface, and the like.

In this manner, when a phenomenon of deteriorating the flow of resin occurs, conductivity is not uniformly distributed over the entire surface of a portion to be thermally adhered thereto.

As illustrated in FIGS. 11A and 11B, when a semiconductor light emitting device is connected to a wiring substrate using an anisotropic conductive film 331 in the display panel 301, the adhesion region of the anisotropic conductive film 331 is similar to or greater than the size of the display panel 301, and a phenomenon of reducing the mobility of resin is further deteriorated.

In the instance of the outside portion, resin flows through the outermost of the adhesion portion to maintain a suitable adhesion thickness, but in the instance of the central portion, the flow of resin is not efficient and thus resin is filled in a relatively thick manner compared to the outside portion. It causes non-uniformity in filling thickness, thereby resulting in a non-uniform conductive ball contact between the central portion and outside portion of the adhesion portion.

FIG. 11B is a SEM analysis result in which the cross section of a large area panel in an adhesion state is cut. The left side of the figure indicates the central portion and the right side thereof indicates the outside portion. In the instance of the central portion on a large area of thermal adhesion, resin is filled in a thick manner due to the non-mobility of resin, thereby causing a phenomenon in which a conductive ball cannot connect between the electrode lines/pads of the upper/lower plates, and in the instance of the outside portion, resin flows to the outside thereof to fill a suitable thickness of resin and thus the conductive ball is pressed in a suitable state between the upper and the lower plate. In other words, it may cause a phenomenon in which conduction is not uniformly distributed at the central portion and the outside portion.

Referring to FIG. 10A again, according to the embodiment of the invention, the resin of the central portion of the anisotropic conductive film 331 is artificially guided to flow through a vacant space adjacent thereto without passing through a long distance of moving path.

In this instance, resin flows out in an arrow direction and vacant spaces are eliminated by filling with resin that has been flowed thereinto. In this manner, the flow or resin is efficiently carried out, thereby implementing a uniform resin filling thickness over the entire area during the large area thermal adhesion. Through this, suitable pressing of conductive balls may be carried out to implement uniform electrical conductivity.

Hereinafter, the specific structure of a display device in which a conductive adhesive layer is partitioned into a plurality of regions will be described.

Figure 12A:
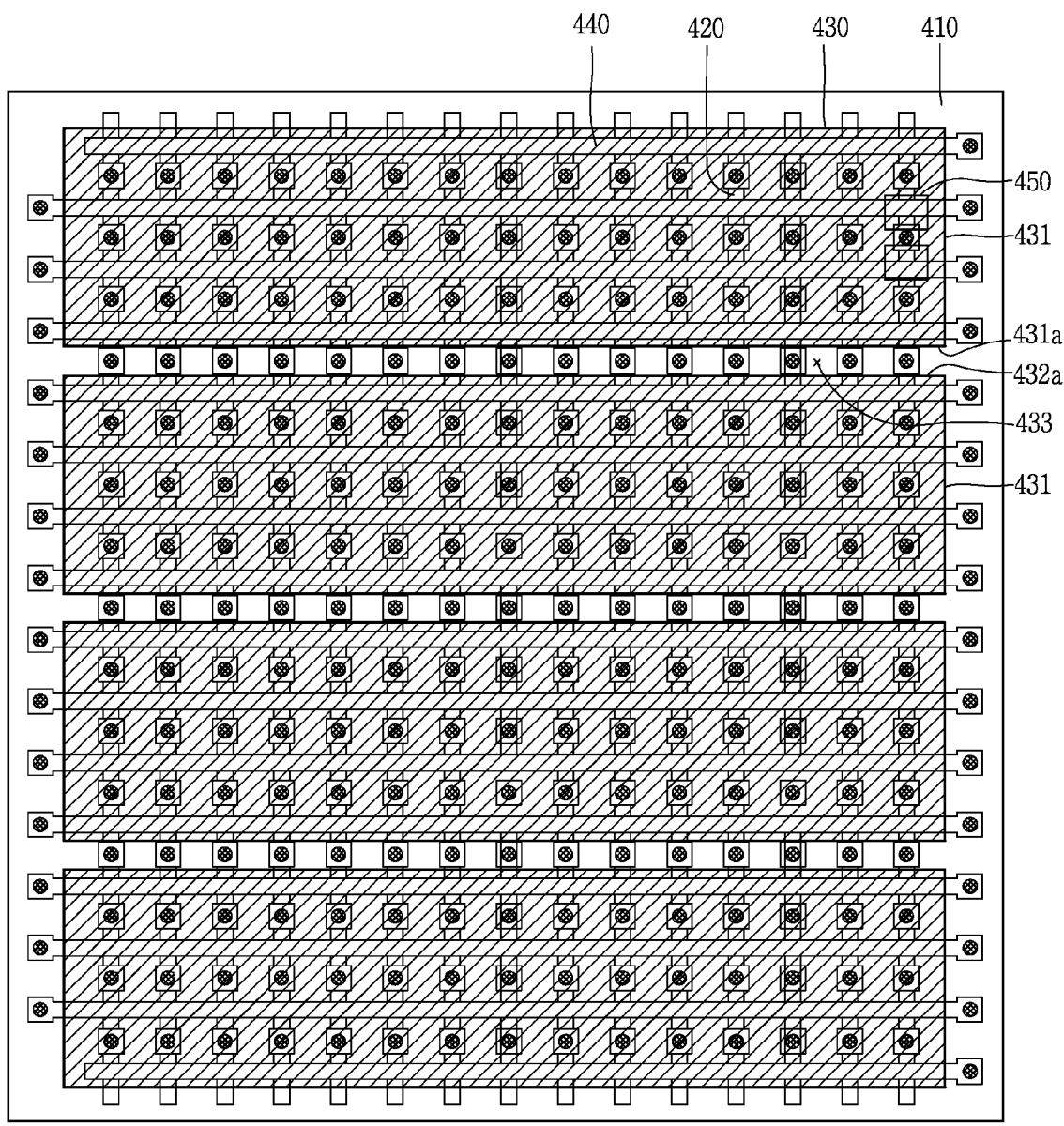
FIGS. 12A, 12B and 12C are a conceptual view, a plan view and a cross-sectional view illustrating an embodiment when a conductive adhesive layer is partitioned into a plurality of regions.
Figure 12B:
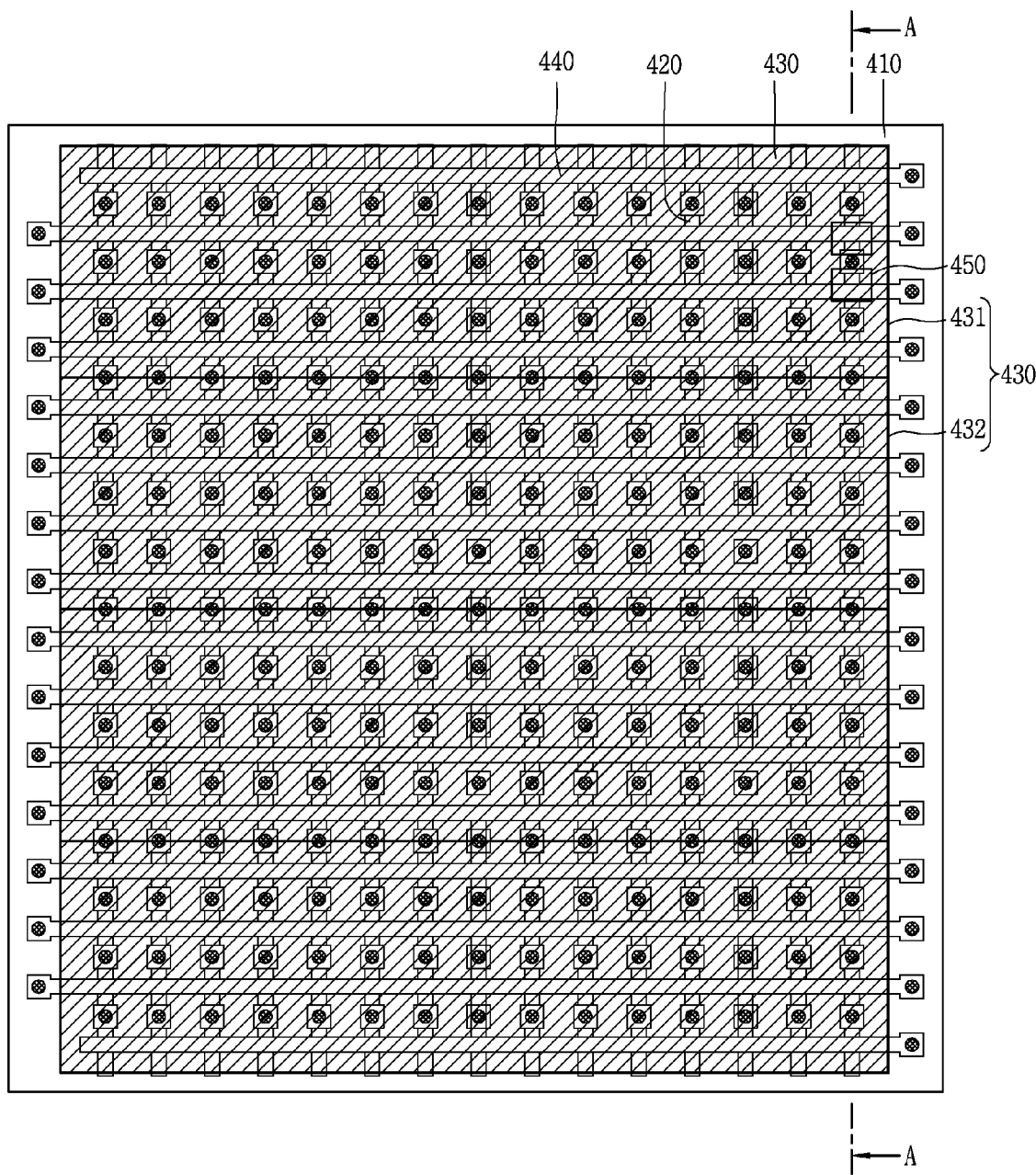
Figure 12C:
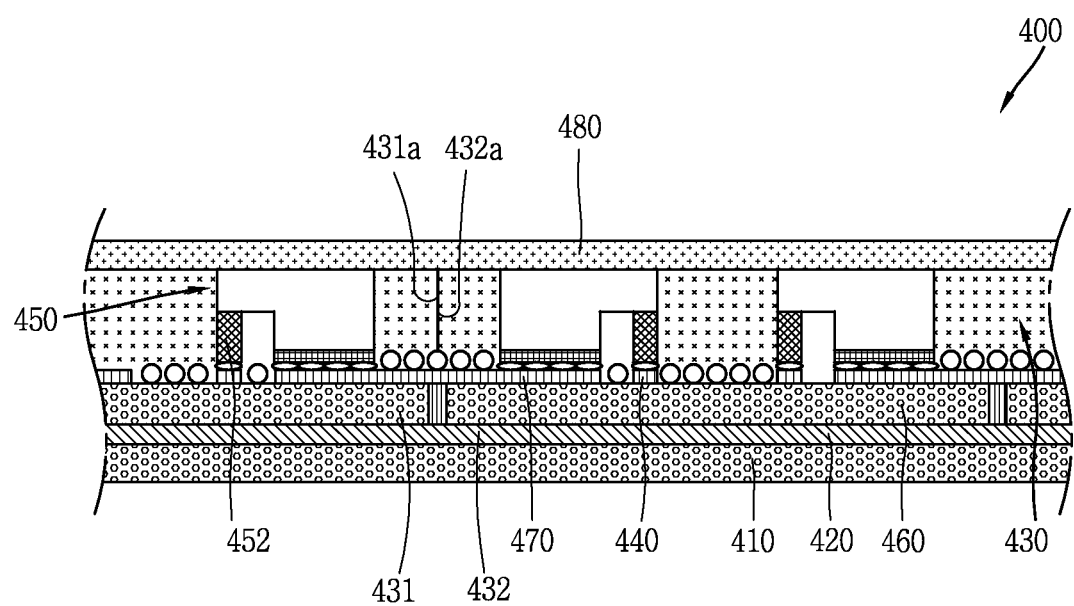

FIGS. 12A, 12B and 12C are a conceptual view, a plan view and a cross-sectional view illustrating an embodiment when a conductive adhesive layer is partitioned into a plurality of regions.

According to the drawing, a display device 100 using a passive matrix (PM) type semiconductor light emitting device is illustrated as a display device 400 using a semiconductor light emitting device. However, the following example will be also applicable to an active matrix (AM) type semiconductor light emitting device.

The display device 400 may include a substrate 410, a conductive adhesive layer 430 and a plurality of semiconductor light emitting devices 450. The semiconductor light emitting device may be a flip chip type light emitting device. However, hereinafter, the semiconductor light emitting device is omitted in the conceptual view and plan view. Furthermore, for the same or similar configuration to the example disclosed in FIGS. 2 through 4, the description thereof will be substituted by the earlier description, and hereinafter, the description thereof will be described around a portion different from the previous one.

The substrate 410 as a wiring substrate, may be any one of polyimide (PI), polyethylene naphthalate (PEN) and polyethylene terephthalate (PET) substrates. Furthermore, an electrode is formed on the substrate 410 as illustrated in the previous example.

According to the drawing, the conductive adhesive layer 430 is partitioned into a plurality of regions on the substrate 410. Hereinafter, it will be described on the basis of a first and a second region, which is a minimum unit of the plurality of regions, but the embodiment of the invention may not be necessarily limited to this, and thus may be divided into a greater number of regions.

The conductive adhesive layer 430 may include a first conductive adhesive layer 431 disposed in a first region, and a second conductive adhesive layer 432 disposed in a second region adjoining to the first region. Through this, boundary portions 431a, 432a are formed between the first conductive adhesive layer 431 and second conductive adhesive layer 432.

According to the embodiment of the invention, a display device may be fabricated through the steps of forming a plurality of conductive adhesive layers on a first substrate containing an electrode, allowing a second substrate (growth substrate) disposed with a plurality of semiconductor light emitting devices to be disposed such that the electrode faces the semiconductor light emitting devices, and then thermally compressing the first substrate to the second substrate to couple the semiconductor light emitting device to the plurality of conductive adhesive layers, and removing the second substrate, similarly to the process described with reference to FIG. 6.

Referring to FIG. 12A, during the step of forming a plurality of conductive adhesive layers, the plurality of conductive adhesive layers 431, 432 are disposed to be separated from each other to have a space 433 that can be expanded during the thermal compression. FIG. 12C is a cross-sectional view taken along line A-A in FIG. 12B, and referring to FIGS. 12B and 12C, during the step of coupling through the thermal compression to allow the boundary portions 431a, 432a of the plurality of conductive adhesive layers 431, 432 to be in contact with each other in a completed display device, the space is filled by the expansion of the plurality of conductive adhesive layers 431, 432 due to the thermal compression.

In this instance, the boundary portions 431a, 432a of the plurality of conductive adhesive layers 431, 432 are formed between the plurality of semiconductor light emitting devices 450.

The conductive adhesive layer may include a plurality of anisotropic conductive films (ACFs) coupled to the substrate 410. The plurality of anisotropic conductive films may include a first and a second anisotropic conductive film corresponding to the first and the second conductive adhesive layer 431, 432. However, the embodiment of the invention may not be necessarily limited to this, and the conductive adhesive layer may be an anisotropic conductive paste, a solution containing conductive particles, and the like as described above.

According to the drawing, the semiconductor light emitting devices 450 are disposed along a plurality of rows, and the boundary portions 431a, 432a are formed in parallel to the rows between at least part of the plurality of rows. The first electrode 420 and the second electrode 440 are formed with a plurality of lines, respectively, and either one of a plurality of lines of the first electrode 420 and a plurality of lines of the second electrode 440 are arranged along the plurality of rows.

The boundary portions 431a, 432a of the first conductive adhesive layer 431 and the second conductive adhesive layer 432 are disposed to be formed in parallel with a plurality of lines of the second electrode. In other words, the first conductive adhesive layer 431 and the second conductive adhesive layer 432 are disposed such that a space therebetween is in parallel with the second electrode.

More specifically, a horizontal directional electrode line (second electrode) and a common electrode pad (auxiliary electrode) therebetween are formed on the substrate 410 (or wiring substrate). Resin on the conductive adhesive layer efficiently flows along the horizontal directional second electrode 420, and in particular, can mostly flow through a space in which there does not exist an auxiliary electrode 470. According to the embodiment of the invention, anisotropic conductive films are disposed in a stripe shape along the horizontal direction, and a horizontal line substrate with no divided space of the films and common electrode is aligned and adhered thereto.

In this instance, a horizontal directional elongated vacant space is formed at a boundary between the divided films, and the vacant space acts as a flow space in which resin can flow. The width of stripe shaped films may be increased or decreased according to the number of horizontal electrode lines contained therein, and the mobility of resin is enhanced as decreasing the width of films as well as increasing the number of divisions. Accordingly, it may be possible to enable a fine resin flow control through a suitable division.

Referring to FIG. 12C, the boundary portion may include a first boundary portion 431a and a second boundary portion 432a formed on the first conductive adhesive layer and the second conductive adhesive layer, respectively, and the boundary portions 431a, 432a of the plurality of conductive adhesive layers 431, 432 of the first and the second anisotropic conductive film are formed to be in contact with each other according to deformation due to thermal compression. In other words, the plurality of anisotropic conductive films are thermally compressed in a state that they are disposed to be separated from each other, and the boundary portions are in contact with each other when resin flows due to the thermal compression to fill a space between the plurality of anisotropic conductive films.

According to the drawing, the first and the second boundary portion 431a, 432a are formed to be in contact with between a plurality of semiconductor light emitting devices. Through this, refraction or the like will not have an effect when emitting the light of the semiconductor light emitting device 450 to the outside.

Furthermore, at least part of the plurality of semiconductor light emitting devices may be buried in the conductive adhesive layer, thereby forming a partition wall between the semiconductor light emitting devices 450. For example, a base member of the anisotropic conductive film may form the partition wall by inserting the semiconductor light emitting device 450 into the anisotropic conductive film. At this time, three surfaces of the semiconductor light emitting device 450 may be completely buried in an upper region of the conductive adhesive layer 430. In this manner, the semiconductor light emitting device 450 may be entirely buried, thereby maximizing an effect of blocking light between the semiconductor light emitting devices 450.

Furthermore, the conductive adhesive layer 430 forming the partition wall contains a non-transparent resin to block light from being transmitted through the semiconductor light emitting devices 450. In other words, light being transmitted through the boundary portions 431a, 432a of the first conductive adhesive layer 431 and the second conductive adhesive layer 432 is blocked by the non-transparent resin. To this end, the non-transparent resin may include a black or white resin. However, the embodiment of the invention may not be necessarily limited to this, and for another example, the conductive adhesive layer 430 may be tinted to block light between the semiconductor light emitting devices 450.

As described above, according to the embodiment of the invention, a conductive adhesive layer is partitioned into a plurality of regions, thereby allowing the resin thickness of an adhesion portion to be uniform during the connection of electrode lines between the upper/lower plates. Hereinafter, various other embodiments of the invention will be described.

Figure 13:
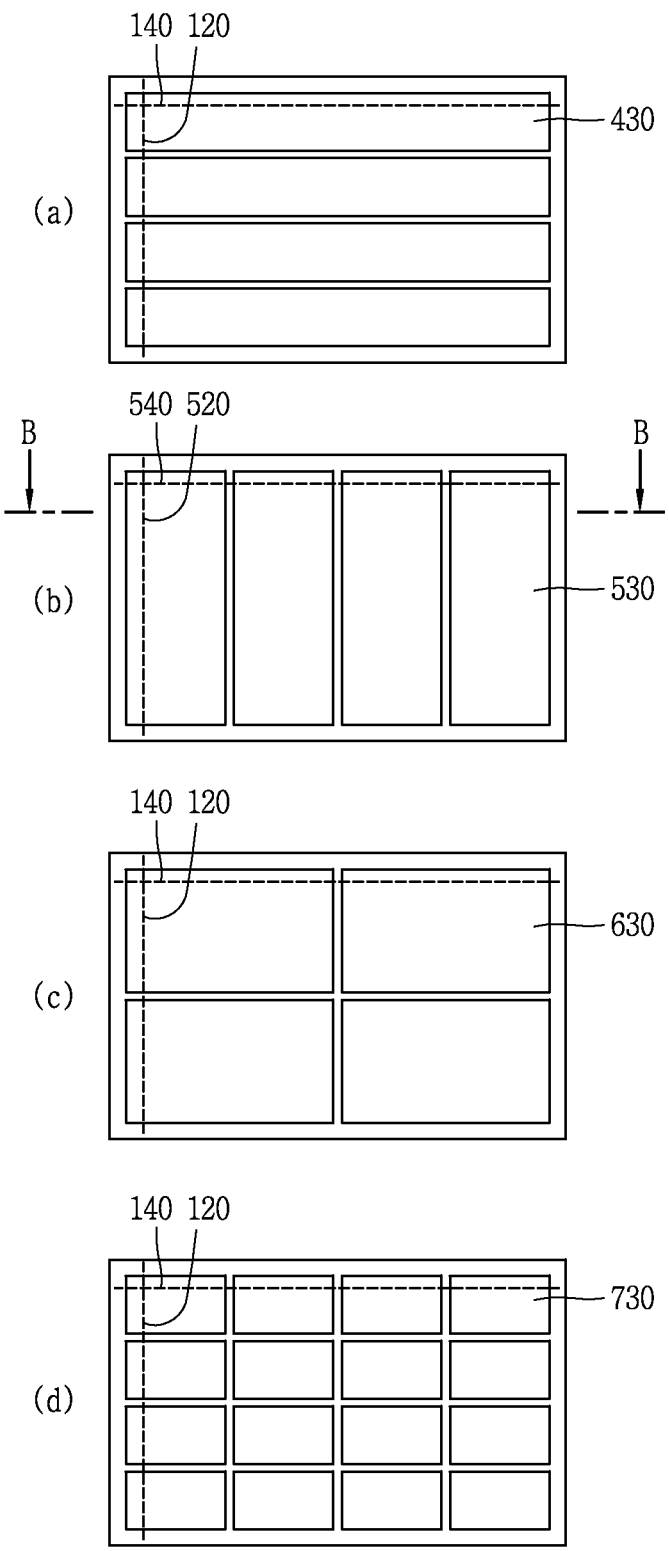
FIG. 13 is conceptual views illustrating a relative size between a conductive adhesive layer and a display panel.
Figure 14:
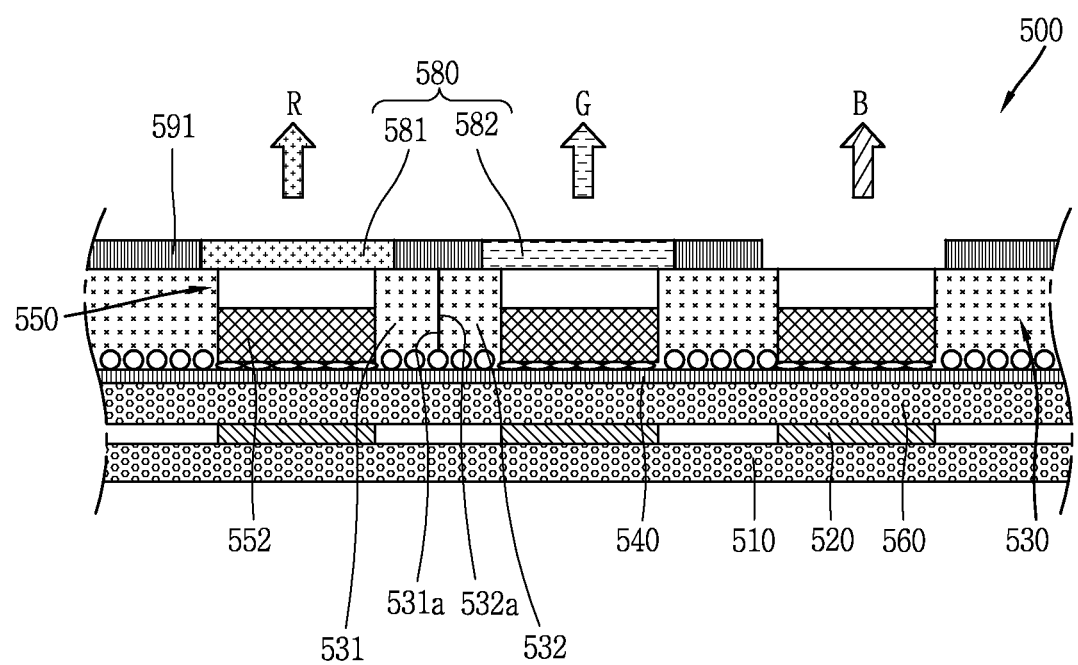
FIG. 14 is a cross-sectional view taken along line B-B in FIG. 13.
Figure 15:
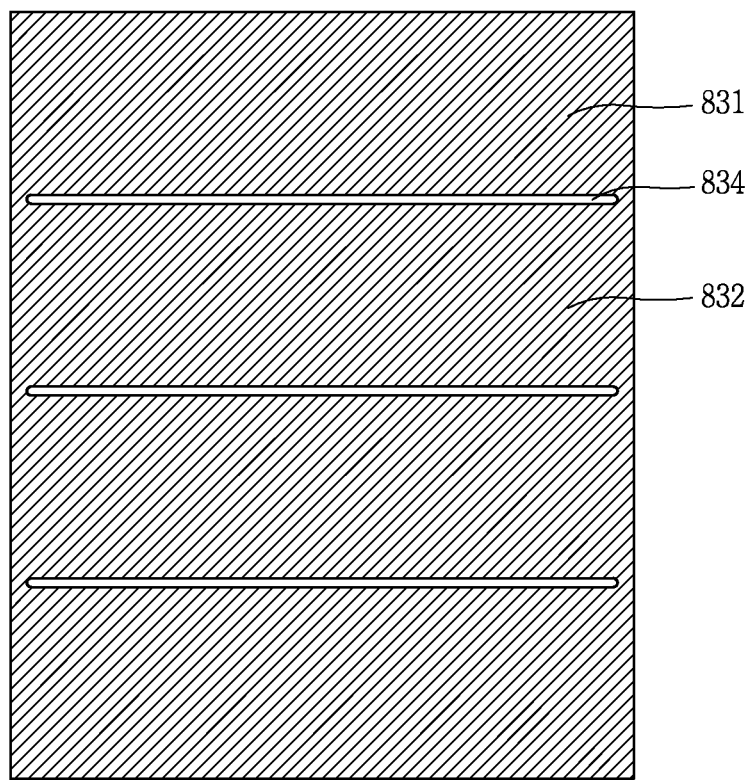
FIG. 15 is a view illustrating another embodiment when a conductive adhesive layer is partitioned into a plurality of regions.

FIG. 13 is conceptual views illustrating a relative size between a conductive adhesive layer and a display panel, and FIG. 14 is a cross-sectional view taken along line B-B in FIG. 13, and FIG. 15 is a view illustrating another embodiment when a conductive adhesive layer is partitioned into a plurality of regions.

Referring to FIG. 13, a plurality of region into which a conductive adhesive layer is partitioned on the substrate may be disposed along the arrangement of the second electrode 140 as well as disposed along the arrangement direction of the first electrode 120 (refer to FIG. 3A).

As illustrated in the drawing, the conductive adhesive layer may be divided with respect to the shape and direction of the electrode line/pad formed on the wiring substrate, and at this time, it may be possible to divide and paste them in a more macro form when the density of the electrode lines/pads formed on the wiring substrate is low.

For example, in addition to an instance where a plurality of conductive adhesive layers 430 are disposed along the first electrode 120 as illustrated in FIG. 13A, the plurality of conductive adhesive layers 430 may be disposed along the second electrode 140 as illustrated in FIG. 13B.

Referring to FIG. 14, a plurality of semiconductor light emitting devices 550 may constitute a light emitting device array, and a phosphor layer 580 is formed on the light emitting device array. For example, the semiconductor light emitting device 550 is a blue semiconductor light emitting device that emits blue (B) light, and the phosphor layer 580 performs the function of converting the blue (B) light into the color of a sub-pixel. The phosphor layer 580 may be a red phosphor layer 581 or green phosphor layer 582 constituting individual pixels. Furthermore, a black matrix 591 may be disposed between each phosphor layer to enhance contrast. In other words, the black matrix 591 may enhance the contrast of luminance.

A first and a second conductive adhesive layer 531, 532 are partitioned at a location corresponding to the black matrix 591. In this manner, the conductive adhesive layers are partitioned along the vertical direction, thereby allowing the boundary portions 531a, 532a of the conductive adhesive layers to be covered by the black matrix 591. Through this, the existence of the boundary portions 531a, 532a may be hidden from the outside.

Furthermore, referring to FIG. 13C, a conductive adhesive layer 630 may be divided into left/right/upper/lower portions, and thus disposed with a plurality of portions, respectively, along the arrangement of the first and the second 120, 140. Furthermore, a conductive adhesive layer 730 may be divided into a greater number along the second electrode as illustrated in FIG. 13D.

Referring to FIG. 15, a first conductive adhesive layer 831 and a second conductive adhesive layer 832 are partitioned by a through hole 834 passing through a single anisotropic conductive film. The through hole 834 is formed in an elongated manner in one direction to form a line. In other words, a plurality of through lines are formed on one anisotropic conductive film, and thus the through line performs the role of a separated space between conductive adhesive layers in the previous embodiment.

A space formed within a film by the through hole 834 may perform the role of a channel through which the resin of the anisotropic conductive film flows and moves since there is no structure of electrode lines and pads. Furthermore, when the through hole 834 is made up according to the deformation of the single anisotropic conductive film due to thermal compression, the through hole 834 may be filled by resin in a completed display device.

Furthermore, the foregoing structure of a display device may be also applicable to a vertical semiconductor light emitting device. Hereinafter, the vertical structure will be described with reference to FIGS. 16A, 16B and 16C.

Figure 16A:
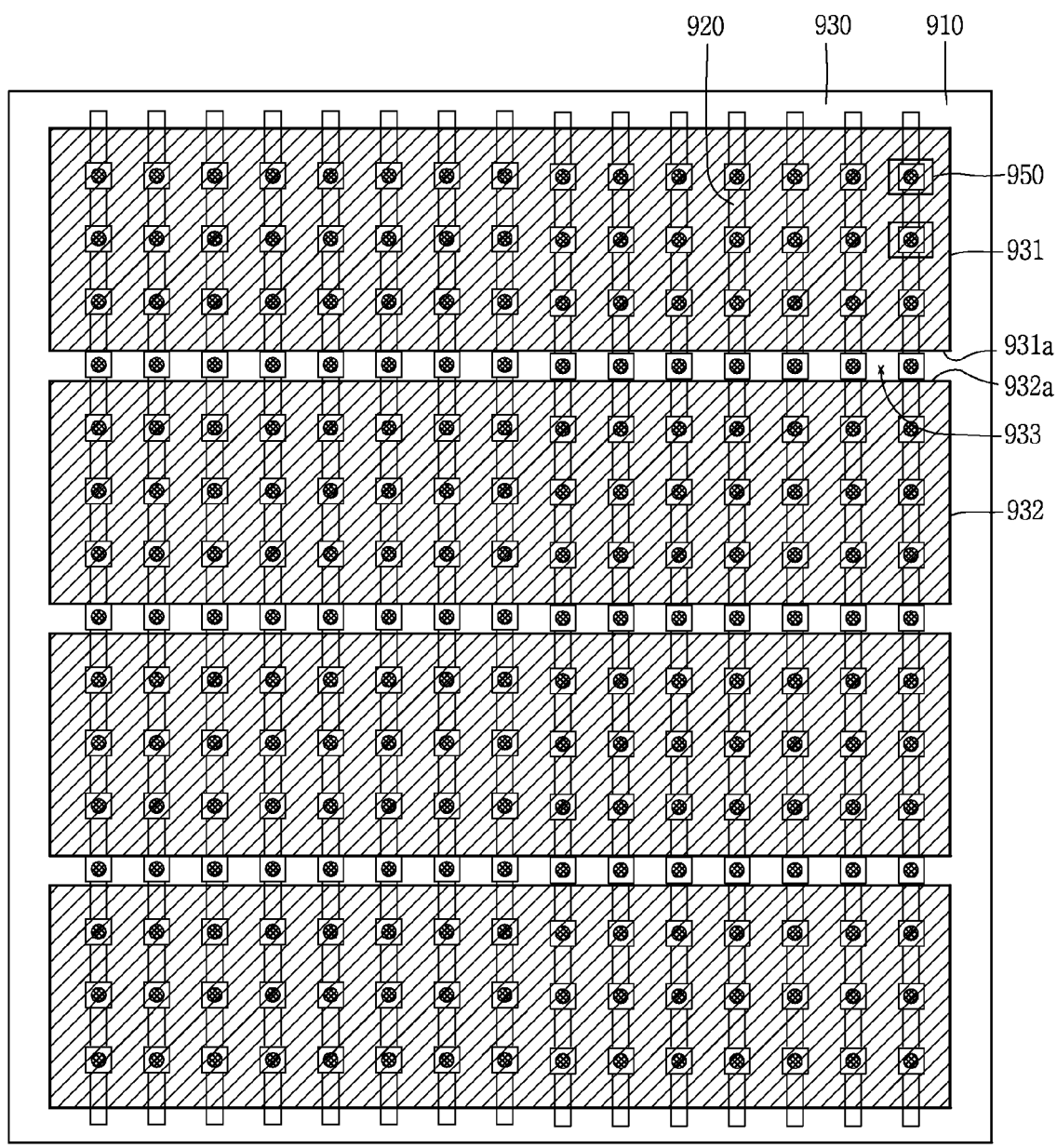
FIGS. 16A, 16B and 16C are a conceptual view, a plan view and a cross-sectional view illustrating still another embodiment when a conductive adhesive layer is partitioned into a plurality of regions.
Figure 16B:
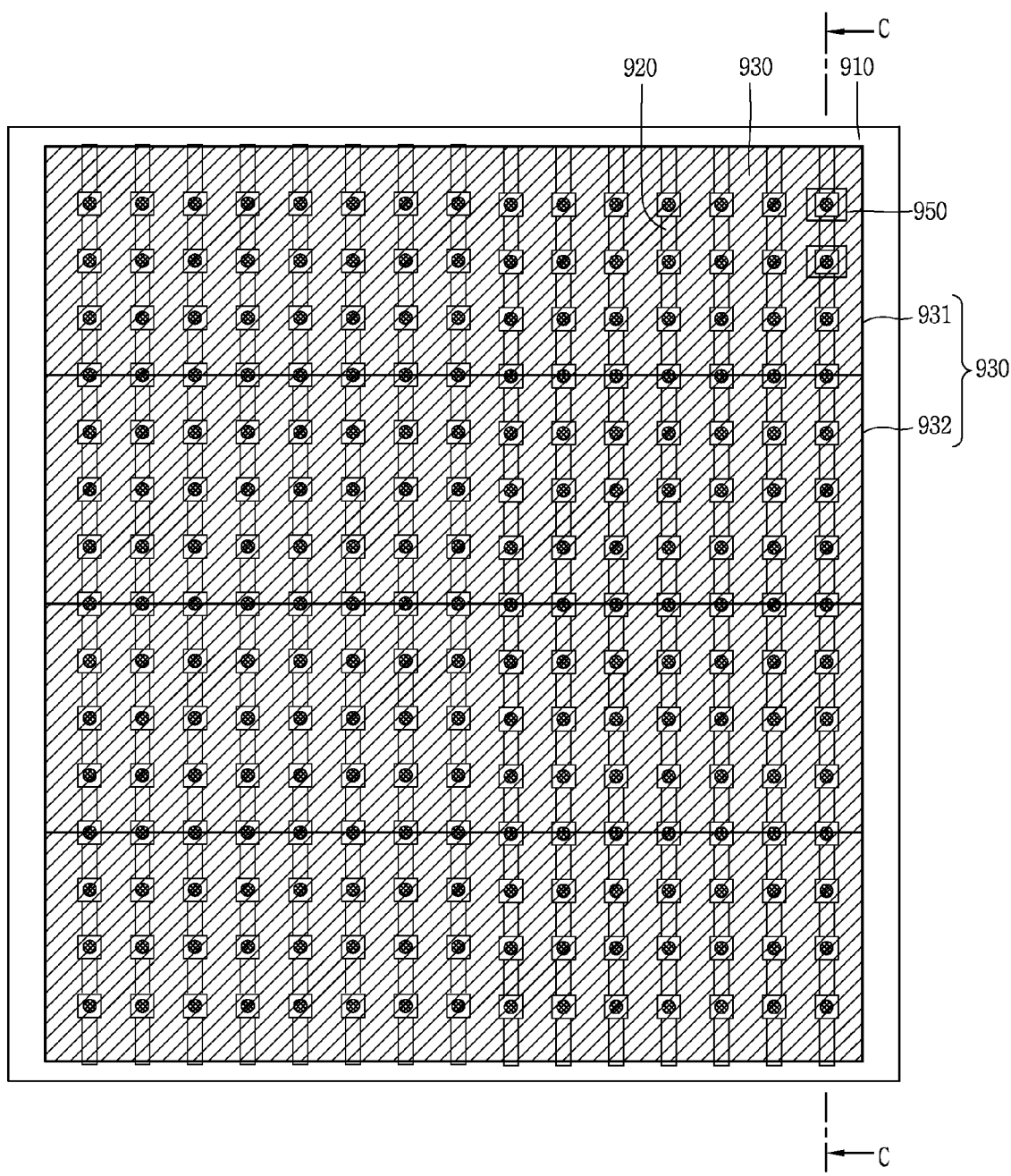
Figure 16C:
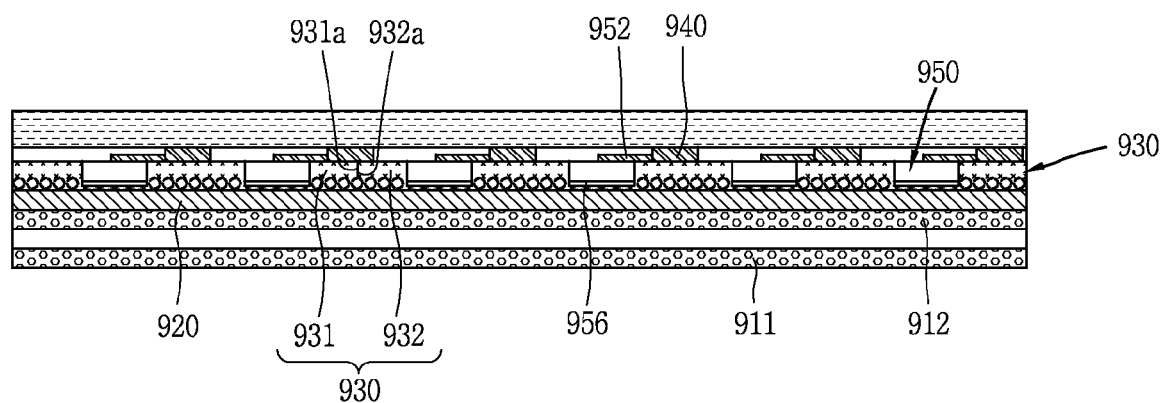

FIGS. 16A, 16B and 16C are a conceptual view, a plan view and a cross-sectional view illustrating still another embodiment when a conductive adhesive layer is partitioned into a plurality of regions.

Referring to the drawings, the display device may be a display device using a passive matrix (PM) type vertical semiconductor light emitting device.

The display device 900 may include a substrate 910, a conductive adhesive layer 930 and a plurality of semiconductor light emitting devices 950. Furthermore, for the same or similar configuration to the example disclosed in FIGS. 7 through 9, the description thereof will be substituted by the earlier description, and hereinafter, the description thereof will be described around a portion different from the previous one.

The substrate 910 as a wiring substrate, may be any one of polyimide (PI), polyethylene naphthalate (PEN) and polyethylene terephthalate (PET) substrates. Furthermore, an electrode is formed on the substrate 910 as illustrated in the previous example.

According to the drawing, the conductive adhesive layer 930 is partitioned into a plurality of regions on the substrate 910. Hereinafter, it will be described on the basis of a first and a second region, which is a minimum unit of the plurality of regions, but the embodiment of the invention may not be necessarily limited to this, and thus may be divided into a greater number of regions.

According to the embodiment of the invention, anisotropic conductive films are disposed in a stripe shape. In this instance, the resin flow of anisotropic conductive films is mostly formed in a direction parallel to the direction of the formed line. In this instance, the moving direction of resin may be guided to a space into which the anisotropic conductive films are divided, namely, both directions, other than one direction.

The width of anisotropic conductive films may be increased or decreased according to the number of columns of the semiconductor light emitting devices contained therein. Furthermore, the mobility of resin may be enhanced as decreasing the width of anisotropic conductive films as well as increasing the number of divisions.

Referring to FIG. 16A, during the step of forming a plurality of conductive adhesive layers, the plurality of anisotropic conductive films 931, 932 are disposed to be separated from each other to have a space 933 that can be expanded during the thermal compression. According to the drawing, the conductive adhesive layers 931, 932 are divided on the basis of a gap between the semiconductor light emitting devices. In other words, a space between the conductive adhesive layers 931, 932 is disposed between the semiconductor light emitting devices, and the space therebetween is arranged in a direction in parallel to the first electrode 920 (in a direction perpendicular to the second electrode). At this time, the second electrode 940 is formed on an upper surface of the conductive adhesive layer, and thus during the step of forming a plurality of conductive adhesive layers, there is no second electrode, and accordingly, the second electrode is not shown in FIG. 16A.

FIG. 16B illustrates an adhesion process completed display device, and FIG. 16C is a cross-sectional view taken along line C-C in FIG. 16B.

Referring to FIGS. 16B and 16C, during the step of coupling through the thermal compression to allow the boundary portions 931a, 932a of the plurality of conductive adhesive layers 931, 932 to be in contact with each other in a completed display device, the space is filled by the expansion of the plurality of conductive adhesive layers 931, 932 due to the thermal compression. Then, the second electrode 940 is formed to cross the boundary portions 931a, 932a of the plurality of conductive adhesive layers 931, 932.

According to the foregoing structure, conduction reliability may be secured even in a display device to which a vertical semiconductor light emitting device is applied.

The configurations and methods according to the above-described embodiments will not be applicable in a limited way to the foregoing display device using a semiconductor light emitting device, and all or part of each embodiment may be selectively combined and configured to make various modifications thereto.

What is claimed is:

1. A display device, comprising:
a wiring substrate having at least one of a first electrode and a second electrode;
a conductive adhesive layer configured to cover the wiring substrate; and
a plurality of semiconductor light emitting devices coupled to the conductive adhesive layer, and electrically connected to the first electrode and the second electrode,
wherein the conductive adhesive layer has a first conductive adhesive layer disposed in a first region and a second conductive adhesive layer disposed in a second region adjoining to the first region such that the conductive adhesive layer is partitioned into a plurality of regions on the wiring substrate, and
wherein a boundary portion between the first conductive adhesive layer and the second conductive adhesive layer is formed between at least part of the plurality of semiconductor light emitting devices.

2. The display device of claim 1, wherein the plurality of semiconductor light emitting devices are disposed along a plurality of rows, and
wherein the boundary portion is formed in parallel to the rows between at least part of the plurality of rows.

3. The display device of claim 2, wherein the first electrode and the second electrode are formed with a plurality of lines, respectively, and either one of a plurality of lines of the first electrode and a plurality of lines of the second electrode are arranged along the plurality of rows.

4. The display device of claim 1, wherein the boundary portion has a first boundary portion and a second boundary portion formed on the first conductive adhesive layer and the second conductive adhesive layer, respectively, and the first boundary portion and the second boundary portion are in contact with each other between the plurality of semiconductor light emitting devices.

5. The display device of claim 1, wherein the conductive adhesive layer comprises a plurality of anisotropic conductive films (ACFs) coupled to the substrate.

6. The display device of claim 1, wherein at least part of the plurality of semiconductor light emitting devices are buried in the conductive adhesive layer, and the conductive adhesive layer has a non-transparent resin to block light from being transmitted through a boundary portion between the first conductive adhesive layer and the second conductive adhesive layer.

7. The display device of claim 6, wherein the non-transparent resin comprises a black or white resin.

8. The display device of claim 1, wherein the wiring substrate is any one of flexible polyimide (PI), polyethylene naphthalate (PEN), and polyethylene terephthalate (PET) substrates.

9. The display device of claim 1, wherein each of the plurality of regions has a length and a width that are different from each other.

10. The display device of claim 1, wherein each of the plurality of semiconductor light emitting devices emits light of at least one of red light, green light, blue light and ultraviolet light.

11. The display device of claim 1, further comprising a phosphor layer to convert a predetermined light into at least one of red light, green light and blue light.

12. The display device of claim 1, wherein the plurality of regions are disposed along the arrangement of the first electrode or disposed along the arrangement direction of the second electrode.

13. A display device, comprising:
a wiring substrate having at least one of a first electrode and a second electrode;
a conductive adhesive layer configured to cover the wiring substrate; and
a plurality of semiconductor light emitting devices coupled to the conductive adhesive layer, and electrically connected to the first electrode and the second electrode,
wherein the conductive adhesive layer has a first conductive adhesive layer disposed in a first region and a second conductive adhesive layer disposed in a second region adjoining to the first region such that the conductive adhesive layer is partitioned into a plurality of regions on the wiring substrate,
wherein the conductive adhesive layer comprises a plurality of anisotropic conductive films (ACFs) coupled to the substrate,
wherein the plurality of anisotropic conductive films have a first anisotropic conductive film and a second anisotropic conductive film corresponding to the first conductive adhesive layer and the second conductive adhesive layer, and
wherein boundary portions between the first and the second anisotropic conductive film are in contact with each other according to deformation due to thermal compression.

14. The display device of claim 13, wherein the boundary portions are in contact with each other as resin flows due to the thermal compression to fill a space between the plurality of anisotropic conductive films.

15. A display device, comprising:
a wiring substrate having at least one of a first electrode and a second electrode;
a conductive adhesive layer configured to cover the wiring substrate; and
a plurality of semiconductor light emitting devices coupled to the conductive adhesive layer, and electrically connected to the first electrode and the second electrode,
wherein the conductive adhesive layer has a first conductive adhesive layer disposed in a first region and a second conductive adhesive layer disposed in a second region adjoining to the first region such that the conductive adhesive layer is partitioned into a plurality of regions on the wiring substrate,
wherein the conductive adhesive layer comprises a single anisotropic conductive film (ACF) coupled to the substrate, and
wherein the first conductive adhesive layer and the second conductive adhesive layer are partitioned by a through hole passing through the single anisotropic conductive film.

16. The display device of claim 15, wherein the through hole is formed in an elongated manner in one direction to form a line.

17. A display device, comprising:
a wiring substrate having at least one of a first electrode and a second electrode;
a conductive adhesive layer configured to cover the wiring substrate; and
a plurality of semiconductor light emitting devices coupled to the conductive adhesive layer, and electrically connected to the first electrode and the second electrode,
wherein the conductive adhesive layer has a first conductive adhesive layer disposed in a first region and a second conductive adhesive layer disposed in a second region adjoining to the first region such that the conductive adhesive layer is partitioned into a plurality of regions on the wiring substrate,
wherein a phosphor layer is formed on one surface of the semiconductor light emitting devices, and the phosphor layer has a black matrix located between each phosphor, and
wherein the first conductive adhesive layer and the second conductive adhesive layer are partitioned at a location corresponding to the black matrix.

18. The display device of claim 17, wherein a boundary portion between the first conductive adhesive layer and the second conductive adhesive layer is covered by the black matrix.

19. A method of fabricating a display device, the method comprising:
forming a plurality of conductive adhesive layers on a first substrate containing an electrode;
allowing a second substrate disposed with a plurality of semiconductor light emitting devices to be disposed such that the electrode faces the semiconductor light emitting devices;
thermally compressing the first substrate to the second substrate to couple the semiconductor light emitting device to the plurality of conductive adhesive layers; and
removing the second substrate, wherein the plurality of conductive adhesive layers are disposed to be separated from each other to have a space that can be expanded during the thermal compression.

20. The method of claim 19, wherein the space is filled by the expansion of the plurality of conductive adhesive layers due to the thermal compression to allow the boundary portions of the plurality of conductive adhesive layers to be contact with each other.

* * * * *